(12) United States Patent
Rauhala

(10) Patent No.: US 9,344,051 B2
(45) Date of Patent: May 17, 2016

(54) APPARATUS, METHOD AND STORAGE MEDIUM FOR PERFORMING ADAPTIVE AUDIO EQUALIZATION

(75) Inventor: Jukka Vesa Tapani Rauhala, Vantaa (FI)

(73) Assignee: Nokia Technologies Oy, Espoo (FI)

( * ) Notice: Subject to any disclaimer, the term of this patent is extended or adjusted under 35 U.S.C. 154(b) by 1070 days.

(21) Appl. No.: 12/459,231

(22) Filed: Jun. 29, 2009

(65) Prior Publication Data

US 2010/0329473 A1    Dec. 30, 2010

(51) Int. Cl.

| | |
|---|---|
| *H03B 29/00* | (2006.01) |
| *G10K 11/16* | (2006.01) |
| *H03G 3/32* | (2006.01) |
| *H03G 5/16* | (2006.01) |
| *H04M 1/60* | (2006.01) |
| *H03G 5/00* | (2006.01) |
| *H04R 3/04* | (2006.01) |

(52) U.S. Cl.
CPC ................. *H03G 3/32* (2013.01); *H03G 5/165* (2013.01); *H04M 1/6016* (2013.01); *H03G 5/005* (2013.01); *H04R 3/04* (2013.01)

(58) Field of Classification Search
CPC ......... H03G 3/32; H03G 5/165; H03G 5/025; H03G 5/005; H04M 1/6016; H04R 3/04; H04S 7/301
USPC ............ 381/71.6, 122, 71.1, 94.1, 94.2, 94.3, 381/57, 56, 98, 103, 71.11; 455/63.1
See application file for complete search history.

(56) References Cited

U.S. PATENT DOCUMENTS

| | | | |
|---|---|---|---|
| 5,481,615 A | 1/1996 | Eatwell et al. | 381/71 |
| 5,509,081 A * | 4/1996 | Kuusama | 381/103 |
| 6,542,436 B1 | 4/2003 | Myllyla | 367/95 |
| 6,639,987 B2 * | 10/2003 | McIntosh | 381/71.6 |
| 6,778,601 B2 | 8/2004 | Ise et al. | 375/232 |
| 2001/0014161 A1* | 8/2001 | Baiker et al. | 381/59 |
| 2002/0086656 A1 | 7/2002 | Mattisson | 455/355 |
| 2007/0223736 A1* | 9/2007 | Stenmark et al. | 381/103 |
| 2010/0246855 A1* | 9/2010 | Chen | 381/107 |

OTHER PUBLICATIONS

"An Augmented Reality Audio Mixer and Equalizer", Ville Riikonen et al., Audio Engineering Society Convention Paper 7372, May 2008, 8 pages.

* cited by examiner

*Primary Examiner* — Vivian Chin
*Assistant Examiner* — Con P Tran
(74) *Attorney, Agent, or Firm* — Harrington & Smith

(57) ABSTRACT

An apparatus, method and computer program where the apparatus includes a filter configured to filter an electrical input signal and provide a filtered electrical input signal to an audio output device; an audio output device configured to convert the filtered electrical input signal to an acoustic output signal; a microphone configured to detect an acoustic signal and provide an electrical output signal corresponding to the detected acoustic signal; and a detector configured to receive the filtered electrical input signal provided to the audio output device as a first input and the electrical output signal provided by the microphone as a second input; wherein the detector is configured to detect a change in the signal power of the electrical output signal provided by the microphone relative to the filtered electrical input signal provided to the audio output device and, in response to the detection of the change in the signal power, provide a control signal to the filter to control the filter to compensate for the detected change in signal power.

17 Claims, 6 Drawing Sheets

APPARATUS, METHOD AND STORAGE MEDIUM FOR PERFORMING ADAPTIVE AUDIO EQUALIZATION

FIELD OF THE INVENTION

Embodiments of the present invention relate to an apparatus, method and computer program. In particular, they relate to an apparatus, method and computer program for controlling an acoustic output signal provided by an audio output device.

BACKGROUND TO THE INVENTION

Apparatus such as telephones comprise loudspeakers which are positioned adjacent to a user's ear during use. The acoustic output signal which is provided by an audio output device may be required to meet certain criteria. For example, the maximum amplitude of the acoustic signal may be limited to avoid injuring a user or damaging components of the apparatus. Also the acoustic output signal of the audio output device may be controlled to provide a particular standard of sound quality to a user to enable the user to clearly hear the acoustic signal.

During use a user may change the way they position an apparatus such as a telephone relative to their ear. For example, they may press the telephone more tightly to their ear when they are in a noisy environment than when they are in a quiet environment. Also different users may hold the apparatus in different ways.

It is useful to ensure that such apparatus give a consistent level of performance irrespective of how they are held during use.

BRIEF DESCRIPTION OF VARIOUS EMBODIMENTS OF THE INVENTION

According to various, but not necessarily all, embodiments of the invention there is provided a n apparatus comprising: a filter configured to filter an electrical input signal and provide a filtered electrical input signal to an audio output device; an audio output device configured to convert the filtered electrical input signal to an acoustic output signal; a microphone configured to detect an acoustic signal and provide an electrical output signal corresponding to the detected acoustic signal; and a detector configured to receive the filtered electrical input signal provided to the audio output device as a first input and the electrical output signal provided by the microphone as a second input; wherein the detector is configured to detect a change in the signal power of the electrical output signal provided by the microphone relative to the filtered input signal provided to the audio output device and, in response to the detection of the change in the signal power, provide a control signal to the filter to control the filter to compensate for the detected change in signal power.

In some embodiments of the invention the microphone may be configured to detect an acoustic signal provided by the audio output device.

In some embodiments of the invention the microphone may be positioned in proximity to the audio output device.

In some embodiments of the invention the input signal provided to the audio output device and the output signal provided by the microphone may comprise a first frequency component and a second frequency component and the detector may be configured to detect a change in the signal power of the first frequency component. The first frequency component may be a low frequency component and the second frequency component may be a high frequency component.

In some embodiments of the invention the apparatus may be configured to be positioned adjacent to a user's ear. The change in signal power detected by the detector may provide a measure of the frequency response of the system comprising the user's ear and the apparatus.

The apparatus may be for wireless communication. For example the apparatus may be a mobile cellular telephone or a wireless earpiece.

According to various, but not necessarily all, embodiments of the invention there is provided a method comprising: receiving a filtered electrical input signal where the filtered electrical input signal is also provided to an audio output device; receiving an electrical output signal provided by a microphone; detecting a change in the signal power of the electrical output signal provided by the microphone relative to the filtered electrical input signal provided to the audio output device; and providing, in response to the detection of the change in the signal power, a control signal to a filter to control the filter to filter the electrical input signal provided to the audio output device to compensate for the detected change in signal power.

In some embodiments of the invention as described in the preceding paragraphs the microphone may detect an acoustic signal provided by the audio output device and convert the detected acoustic signal into the electrical output signal.

In some embodiments of the invention as described in the preceding paragraphs the microphone may be positioned in proximity to the audio output device.

In some embodiments of the invention as described in the preceding paragraphs the input signal provided to the audio output device and the output signal provided by the microphone may comprise a first frequency component and a second frequency component and the detected change in the signal power of the output signal provided by the microphone may correspond to a change in the signal power of the first frequency component. The first frequency component may be a low frequency component and the second frequency component may be a high frequency component.

In some embodiments of the invention as described in the preceding paragraphs the audio output device and microphone may be positioned adjacent to a user's ear. In some embodiments of the invention the detected change in signal power may provide a measure of the frequency response of the system comprising the user's ear.

According to various, but not necessarily all, embodiments of the invention there is provided a computer program comprising computer program instructions configured to control an apparatus, the program instructions enabling, when loaded into a controller; receiving a filtered electrical input signal where the filtered electrical input signal is also provided to an audio output device; receiving an electrical output signal provided by a microphone; detecting a change in the signal power of the electrical output signal provided by the microphone relative to the filtered electrical input signal provided to the audio output device; and providing, in response to the detection of the change in the signal power, a control signal to a filter to control the filter to filter the electrical input signal provided to the audio output device to compensate for the detected change in signal power.

In some embodiments of the invention there may be provided a computer program comprising program instructions for causing a computer to perform a method as described above.

In some embodiments of the invention there may be provided an electromagnetic carrier signal carrying the computer program as described above.

In some embodiments of the invention there may be provided a computer-readable storage medium encoded with instructions that, when executed by a processor, perform a method as described above.

According to various, but not necessarily all, embodiments of the invention there is provided an apparatus comprising: a first input configured to receive a filtered electrical input signal provided to an audio output device; a second input configured to receive an electrical output signal provided by a microphone; an output configured to provide a control signal to a filter which filters the electrical input signal provided to the audio output device; wherein the apparatus is configured to detect a change in the signal power of the electrical output signal provided by the microphone relative to the input signal provided to the audio output device and, in response to the detection of the change in the signal power, provide the control signal to the filter to control the filter to compensate for the detected change in signal power.

In some embodiments of the invention the filtered electrical input signal provided to the audio output device and the electrical output signal provided by the microphone may comprise a first frequency component and a second frequency component and the apparatus may be configured to detect a change in the signal power of the first frequency component. The first frequency component may be a low frequency component and the second frequency component may be a high frequency component.

The apparatus may be for detecting the change in the signal power of a first input signal relative to a second input signal.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
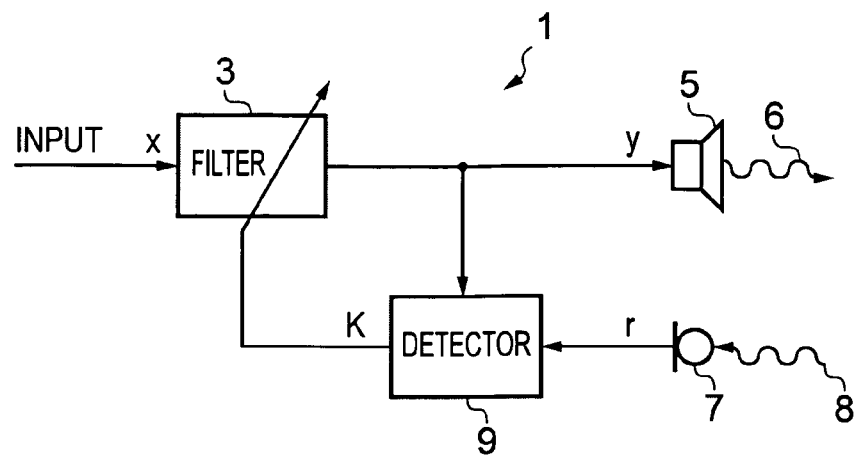
FIG. 1 schematically illustrates an apparatus according to a first embodiment of the invention.

The Figures illustrate an apparatus 1 comprising: a filter 3 configured to filter an electrical input signal x and provide a filtered electrical input signal y to an audio output device 5; an audio output device 5 configured to convert the filtered electrical input signal y to an acoustic output signal 6; a microphone 7 configured to detect an acoustic signal 8 and provide an electrical output signal r corresponding to the detected acoustic signal 8; and a detector 9 configured to receive the filtered electrical input signal y provided to the audio output device 5 as a first input and the electrical output signal r provided by the microphone 7 as a second input; wherein the detector 7 is configured to detect a change in the signal power of the electrical output signal r provided by the microphone 7 relative to the filtered electrical input signal y provided to the audio output device 5 and, in response to the detection of the change in the signal power, provide a control signal K to the filter 3 to control the filter 3 to compensate for the detected change in signal power.

In the following description, unless expressly stated otherwise, the words "connect" and "couple" and their derivatives mean operationally connected or operationally coupled. It is to be appreciated that any number or combination of intervening components can exist including no intervening components.

FIG. 1 schematically illustrates an apparatus according to a first embodiment of the invention. The apparatus comprises a filter 3, an audio output device 5, a microphone 7 and a detector 9. Only features referred to in the following description are illustrated. It should, however, be understood that the apparatus 1 may comprise additional features that are not illustrated.

The apparatus 1 may be any apparatus which comprises an audio output device 5 which may be positioned adjacent to a user's ear in use. For example, the apparatus 1 may be a telephone such as a cellular mobile telephone or an earpiece. The audio output device 5 may, for example, be a loudspeaker, or other form of audio transducer that converts an electrical signal to acoustic pressure waves.

The filter 3 is configured to receive an electrical input signal x and provide a filtered electrical output signal y. The electrical input signal x may be received from an audio apparatus. The audio apparatus may be any means which produces an audio output such as a cellular mobile telephone or an earpiece. The electrical input signal x may correspond to speech which is part of a telephone conversation.

The electrical input signal x provided to the filter 3 may comprise a plurality of different frequency components. The filter 3 may be configured to filter the electrical input signal x by attenuating some of the frequency components. In some embodiments of the invention the filter 3 may be configured to attenuate some frequency components and enhance other frequency components. The filter 3 may be an equalization filter. For example the filter 3 may be a shelving filter.

The filter 3 may be configured to filter the electrical input signal x to enable an acoustic signal 6, provided by the audio output device 5 in response to the filtered electrical input signal y, to fulfill certain criteria. For example it may attenuate certain frequencies to prevent the acoustic output signal 8 having a large amplitude which may injure a user or damage some of the electrical components of the apparatus 1. The filter 3 may also enhance or attenuate certain frequencies to provide an improved sound quality for the user of the apparatus 1. The filter is able to produce a desired magnitude response to the ear improving the perceived audio quality.

The audio output device 5 is configured to convert the filtered electrical input signal y to an acoustic output signal 6. The acoustic output signal 6 may comprise a plurality of different frequency components. The plurality of different frequency components may comprise frequency components from the audible frequency range. The acoustic output signal 6 may comprise a first frequency component and a second frequency component. The first frequency component may be a low frequency component, for example, the first frequency component may comprise frequencies in the range 0-1.5 kHz. The second frequency component may be a high frequency component, for example, the second frequency component may comprise frequencies in the range 2.5-4 kHz.

In embodiments of the invention where the apparatus 1 is a telephone or earpiece the output signal 6 may comprise speech which is part of a telephone conversation.

The microphone 7 is configured to detect the acoustic input signal 8 and convert this into an electrical output signal r.

The microphone 7 may be positioned within the apparatus 1 so that the detected acoustic input signal 8 provides a measure of the frequency response of the system comprising the apparatus 1 and the user's ear. The detected acoustic input signal 8 may comprise components of the acoustic output signal 6 which have been reflected by the user's ear. The frequency response may be unique to each user and also to each ear of each user. The frequency response may also be dependent on how the apparatus 1 is positioned relative to the user's ear. For example the frequency response may depend on how tightly the apparatus 1 is pressed next to the user's ear and the amount of leakage between the apparatus 1 and the user's ear and the distance between the audio output device 5 and the user's eardrum.

The detector 9 is configured to receive the filtered electronic input signal y as a first input and the electrical output signal r provided by the microphone 7 as a second input. The detector 9 is configured to compare the signal power of the electrical output signal r provided by the microphone 7 to the signal power of the filtered electronic input signal y and detect a change in the relative signal power. The signal power may be determined over an appropriate time interval. For example, the signal power may be calculated over the duration of each speech frame. A speech frame is typically 20 ms.

The detector 9 is configured to provide the control signal K in response to the detection of a change in the relative signal power. A change in the relative signal power may occur if, for example, a user changes the position of the apparatus 1 relative to their ear during use. This may change the size of the gap between the apparatus 1 and the user's ear and so change the amount of leakage of the acoustic output signal 6. This changes the frequency response of the system comprising the apparatus 1 and the user's ear.

The detector 9 is coupled to the filter 3 so that the control signal K is provided to the filter 3. The control signal K controls the filter 3 to filter the electrical input signal x to compensate for the detected change in the relative signal power. The value of the control signal K may depend on whether the relative signal power level has increased or decreased. The magnitude of the control signal K may depend on the magnitude of the detected change in the signal power.

Figure 2:
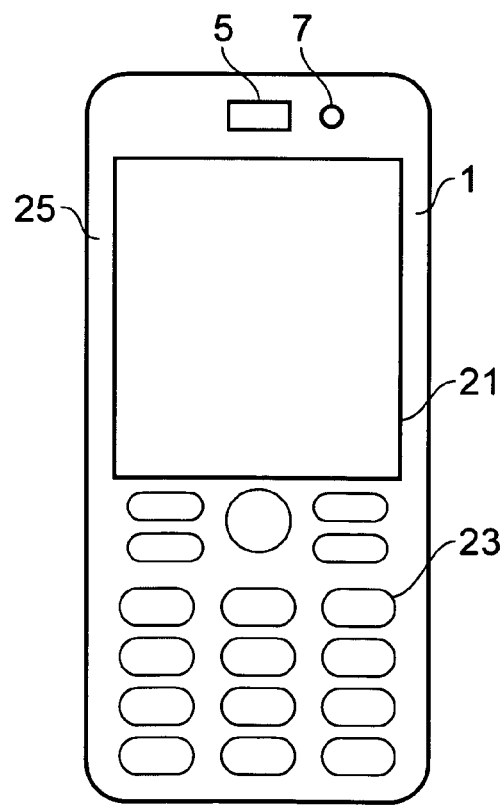
FIG. 2 illustrates an apparatus according to embodiments of the invention.

FIG. 2 illustrates an apparatus 1 according to embodiments of the invention. In the particular embodiment illustrated in FIG. 2 the apparatus 1 is a cellular mobile telephone.

The apparatus 1 comprises a housing 25, an audio output device 5 and a microphone 7. The electronic components of the apparatus 1 may be contained within the housing 25. The housing 25 may be sized and shaped so that it may be held comfortably in a user's hand.

The audio output device 5 is positioned within the housing 25 so that when the user holds the apparatus 1 close to their head the audio output device 5 is positioned adjacent to their ear. The audio output device 5 is positioned so that the acoustic output signal 6 is directed outwards from the apparatus 1.

The microphone 7 is positioned within the housing 25 in proximity to the audio output device 5. In the embodiment of the invention illustrated in FIG. 2 the microphone is positioned adjacent to the audio output device 5. The microphone 7 is positioned so that it provides a measure of the frequency response of the system comprising the apparatus 1 and the user's ear. The microphone 7 may be positioned to detect acoustic input signals which are reflected from the user's ear.

In the embodiment illustrated in FIG. 2 the apparatus 1 also comprises a display 21 and a keypad 23. The keypad 23 enables a user to make user inputs to control the apparatus 1. The display 21 is configured to display information to a user. The microphone 7 and the audio output device 5 are positioned above the display 21 and the keypad 23.

Figure 3:
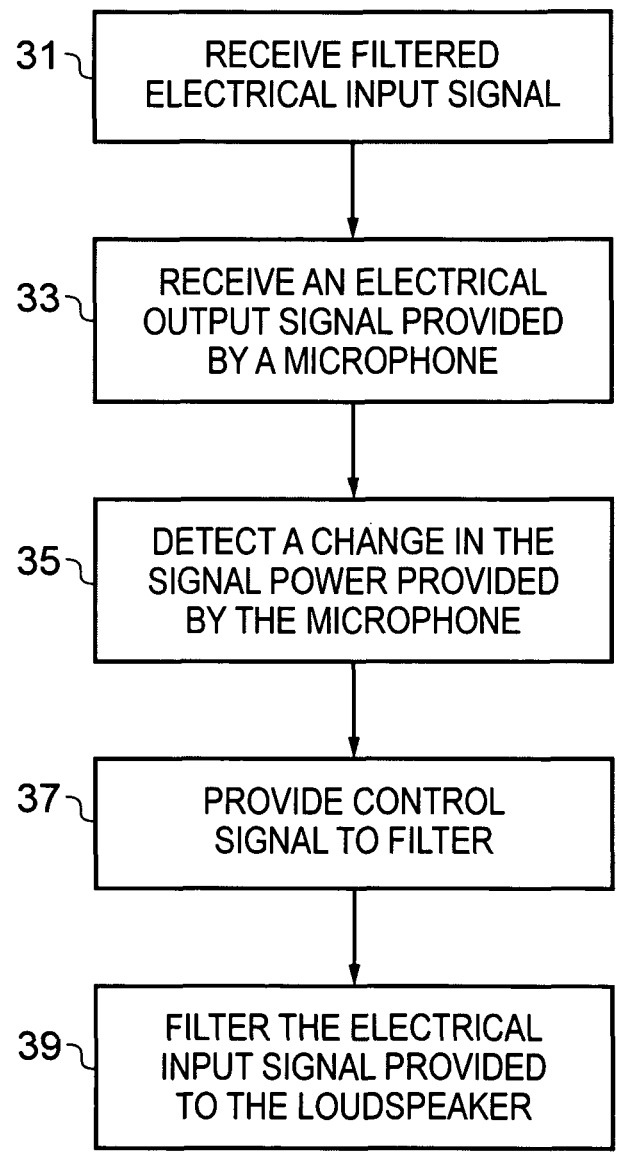
FIG. 3 illustrates a flow chart showing a method according to an embodiment of the invention.

FIG. 3 illustrates a flow chart showing a method which may be carried out by an apparatus 1 according to embodiments of the invention. Blocks 31, 33, 35 and 37 of the method may be carried out by the detector 9. Block 39 may be carried out by the filter 3.

At block 31 the detector 9 receives the filtered electrical input signal y as a first input. The filtered electrical input signal y is also provided to the audio output device 5 where it is converted into the acoustic output signal 6. The filtered electrical input signal y corresponds to the electrical input signal x which has been filtered by the filter 3.

As mentioned above the filtered electrical input signal y comprises a plurality of frequency components. The plurality of frequency components may comprise a high frequency band and a low frequency band. The high frequency band may comprise frequencies in the range 2.5-4 kHz. The low frequency band may comprise frequencies in the range 0-1.5 kHz.

At block 33 the detector 9 receives the electrical output signal r provided by the microphone 3. The electrical output signal r corresponds to an acoustic input signal 8 which has been detected by the microphone 7. The detected input acoustic signal 8 may provide a measure of the frequency response of the system comprising the apparatus 1 and the user's ear. The detected input acoustic signal 8 may comprise components of the acoustic output signal 6 which have been reflected by a user's ear.

The electrical output signal r also comprises a plurality of frequency components. The plurality of frequency components may comprise a high frequency band and a low frequency band. The high frequency band may comprise frequencies in the range 2.5-4 kHz. The low frequency band may comprise frequencies in the range 0-1.5 kHz.

At block 35 the detector 9 detects a change in the signal power of the electrical output signal r relative to the filtered electrical input signal y. The change in relative signal power may arise, for example, if the user changes the way they are holding the apparatus. For example, if the user is in a noisy environment they may press the apparatus 1 more tightly to their ear. This reduces the gap between the apparatus 1 and the user's ear and so reduces the amount of leakage of the acoustic signal 6. This changes the frequency response of the system comprising the apparatus 1 and the user's ear.

The change in position of the apparatus 1 may affect some frequencies more than others. For example the position of the apparatus 1 relative to the user's ear may affect the low frequency band more than the high frequency band as illustrated in FIG. 4.

Figure 4:
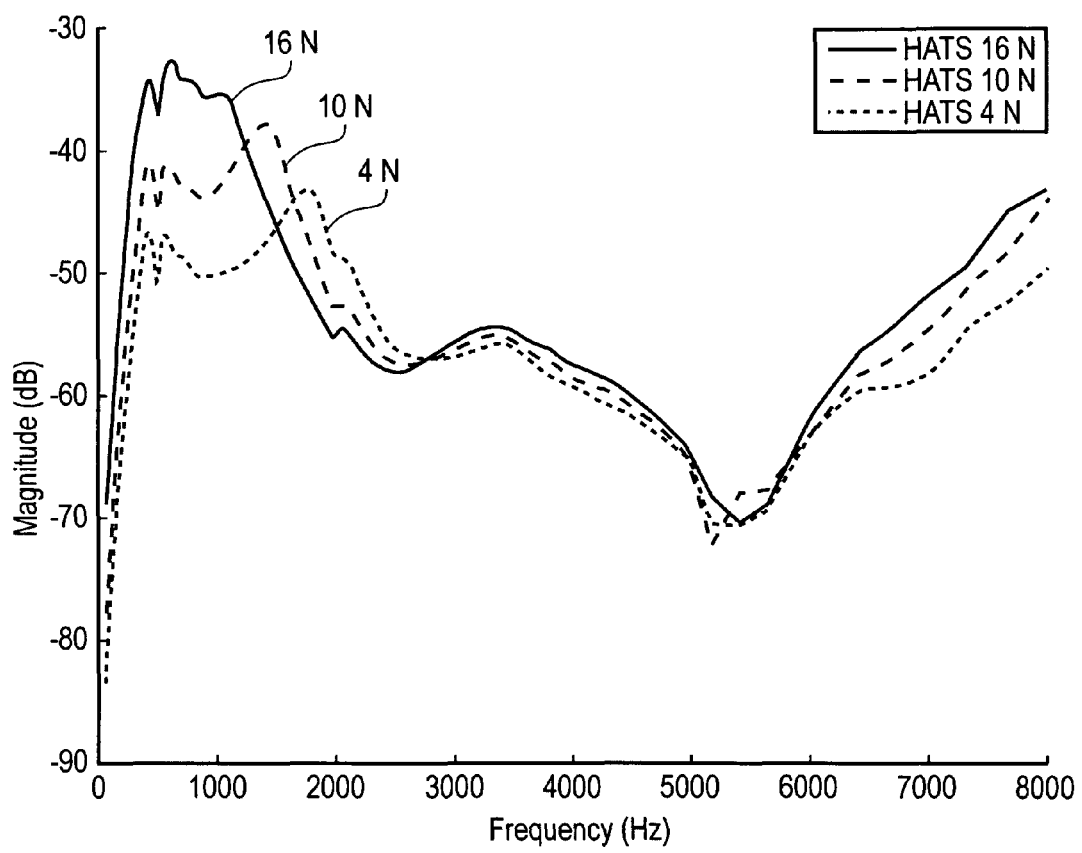
FIG. 4 illustrates a plot of the magnitude of the frequency response measured in a user's ear canal against the frequency.

FIG. 4 is an example of a plot of the magnitude of the frequency response measured in a user's ear canal against the frequency for a plurality of different forces being applied to the apparatus 1. The first plot corresponds to the apparatus 1 being pressed against the user's ear with a force of 16N, the second plot corresponds to the apparatus 1 being pressed against the user's ear with a force of 10N and the third plot corresponds to the apparatus 1 being pressed against the user's ear with a force of 4N.

The first plot has the largest frequency response for frequencies in the band 0-1.5 kHz and the third plot has the lowest frequency response for this band. Therefore it can be seen that increasing the force applied to the apparatus 1 by pressing the apparatus 1 more closely to a user's ear will boost the low frequency response of the system.

All three plots have a similar magnitude for frequencies in the range 2.5-4 kHz. Therefore it can be seen that the changing the force applied to the apparatus does not effect the frequency response of the system for the high frequency band very much.

As the force applied to the apparatus affects the low frequency band more than the high frequency band this may lead to distortion of an acoustic output signal 6. This may reduce the sound quality perceived by the user. Where the acoustic output signal 6 comprises speech it may make it difficult for the user to understand the speech.

Referring back to FIG. 3, once the change in signal power has been detected the detector 9, at block 37, provides the control signal K to the filter 3. The value of the control signal K may depend on whether the relative signal power level has increased or decreased. For example, it may depend on whether the user has increased the force applied to the apparatus 1 or decreased the force applied to the apparatus 1. The magnitude of the control signal K may depend on the magnitude of the detected change in the signal power. This may depend on the amount by which the user has changed the force applied to the apparatus 1.

At block 39 the filter 3 receives the control signal K and filters the electrical input signal provided to the audio output device 5. The control signal K controls the filter to compensate for the detected change in signal power.

Block 35 where the detector 9 detects a change in the signal power of the electrical output signal r relative to the signal power of the filtered electrical input signal y may occur separately for different frequency bands.

For example, one block 35 may detect a change in the signal power ($P_{r\ low}$) of the electrical output signal r in a first lower frequency band relative to the signal power ($P_{y\ low}$) of the filtered electrical input signal y in the first lower frequency band. The change may be determined by, for example, dividing the signal power ($P_{r\ low}$) of the electrical output signal r in a first lower frequency band by the signal power ($P_{y\ low}$) of the filtered electrical input signal y in the first lower frequency band.

Before the change is determined, the signal power ($P_{r\ low}$) of the electrical output signal r in a first lower frequency band may be normalized with respect to the signal power ($P_{r\ high}$) of the electrical output signal r in a second higher frequency band. This may be achieved by dividing the signal power ($P_{r\ low}$) of the electrical output signal r in the first lower frequency band by the signal power ($P_{r\ high}$) of the electrical output signal r in the second higher frequency band.

Before the change is determined, the signal power ($P_{y\ low}$) of the filtered electrical input signal y in the first lower frequency band may be normalized with respect to the signal power ($P_{y\ high}$) of the filtered electrical input signal y in the second higher frequency band. This may be achieved by dividing the signal power ($P_{y\ low}$) of the filtered electrical input signal y in the first lower frequency band by the signal power ($P_{y\ high}$) of the filtered electrical input signal y in the second higher frequency band.

In some implementations, a change in signal power may be simultaneously determined for multiple different low frequency bands. The same higher frequency band may be used as a normalizing reference.

Signals may be divided into different frequency bands before signal power determination using for example pass filters. A pass filter is a filter that allows a selected frequency band to pass either because it is a band pass filter, a low pass filter or a high pass filter. In other implementations, a transformer may be used to convert signals from the time domain to spectral bands in the frequency domain.

For example, if the detector 9 has detected an increase in the signal power for the low frequency band then the control signal K will control the filter to attenuate the low frequency components of the electrical input signal x. The increase in the signal power for the low frequency band may occur if the user increases the force with which they are pressing the apparatus 1 to their ear. Conversely if the detector 9 has detected a decrease in the signal power of the low frequency band then the control signal K will control the filter 3 to enhance the low frequency components of the electrical input signal x. The decrease in the signal power for the low frequency band may occur if the user decreases the force with which they are pressing the apparatus 1 to their ear The blocks illustrated in FIG. 3 may represent steps in a method and/or sections of code in the computer program. The illustration of a particular order to the blocks does not necessarily imply that there is a required or preferred order for the blocks and the order and arrangement of the block may be varied. Furthermore, it may be possible for some steps to be omitted.

Embodiments of the invention therefore provide the advantage that the filter 3 may be controlled to filter the electrical input signal x to compensate for any distortion of the acoustic output signal 6 which may arise as a result of a change in position of the apparatus 1. This enables a good sound quality to be provided to a user irrespective of the force applied to the apparatus 1 when they are holding the apparatus 1 next to their ear.

Also, embodiments of the invention may provide the advantage that they decrease the amplitude of the low frequency signals which may prevent injury to a user and may also prevent damage to components of the apparatus 1.

Embodiments of the invention detect a change in the position of the apparatus 1 by detecting a change in the signal power. The signal power calculation is a may be carried out quickly. This means that only a small amount of processing power is required. It also enables the apparatus 1 to respond quickly to a change in the position of the apparatus 1 so that the filter 3 may compensate for the change in position without any noticeable reduction in sound quality by the user.

Figure 5:
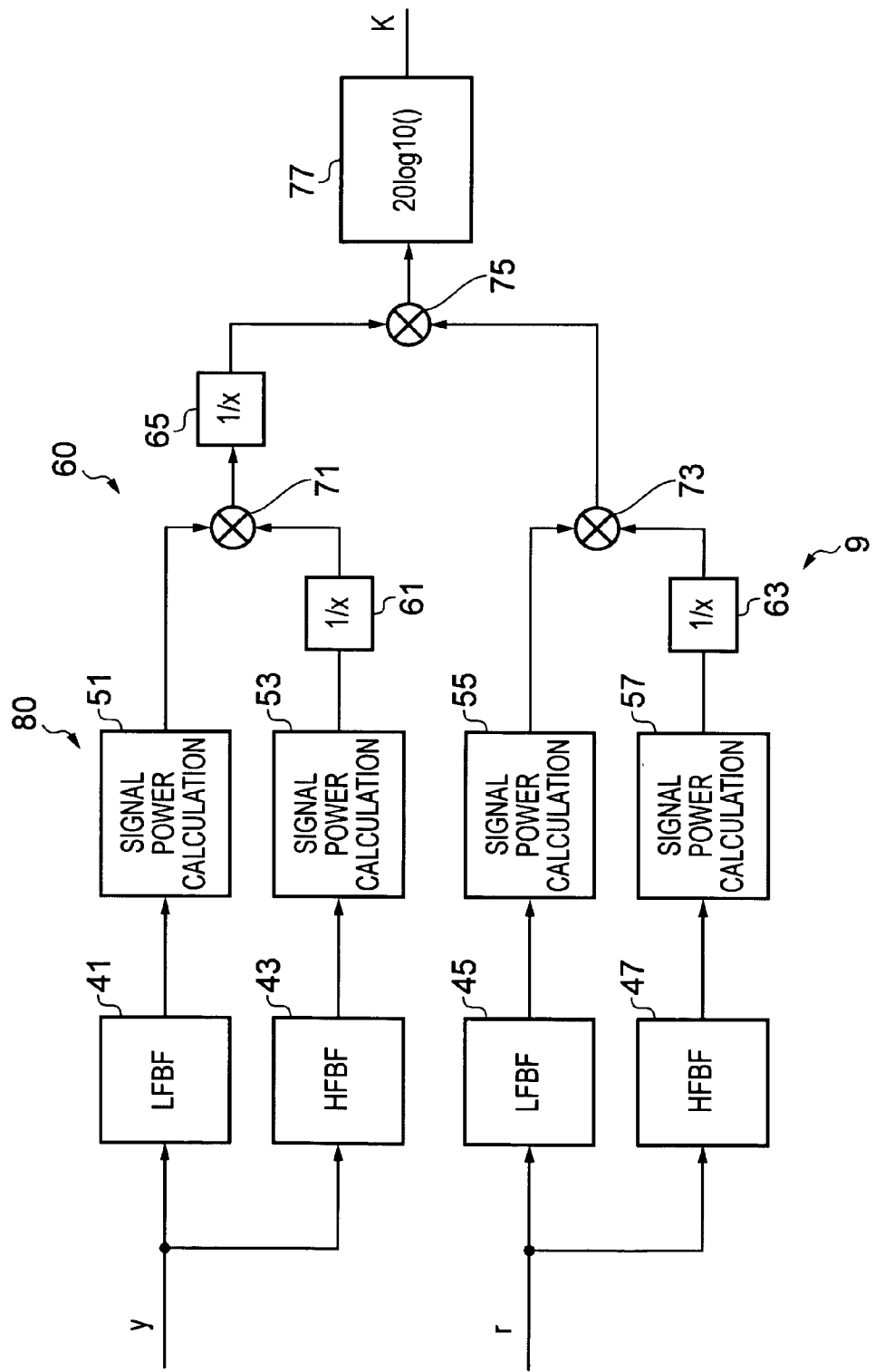
FIG. 5 illustrates a detector according to an embodiment of the invention.

FIG. 5 schematically illustrates a detector 9 according to an embodiment of the invention in more detail. The detector 9 comprises a plurality of frequency band filters 41, 43, 45, 47, means for calculating the signal power 50, means for comparing the relative signal power 60 and means 77 for providing a control signal K as an output.

The first frequency band filter 41 is a low frequency band filter which is configured to allow the low frequency components to pass through but attenuates the high frequency components. The first frequency band filter 41 is configured to receive the filtered electronic input signal y as an input. The filtered electronic input signal y is also provided to the audio output device 5 which is not illustrated in FIG. 5.

The first frequency band filter 41 is coupled to first signal power calculation means 51 so that the output of the first frequency band filter 41 is provided to the first signal power calculation means 51. The signal power calculation means may be configured to determine the signal power of an input signal using any suitable method. The first signal power calculation means 51 are configured to determine the signal power in the low frequency components of the filtered electronic input signal y and provide this an output signal $P_{y\ low}$.

The second frequency band filter 43 is a high frequency band filter which is configured to allow the high frequency components to pass through but attenuates the low frequency components. The second frequency band filter 43 is also configured to receive the filtered electronic input signal y as an input.

The second frequency band filter 43 is coupled to second signal power calculation means 53 so that the output of the second frequency band filter 43 is provided to the second signal power calculation means 53. The second signal power calculation means 53 are configured to determine the signal power in the high frequency components of the filtered electrical input signal y and provide this an output signal $P_{y\ high}$.

The output signal $P_{y\ high}$ of the second power calculation means 53 is provided to an inverter 61 which inverts the signal $P_{y\ high}$ to provide $1/P_{y\ high}$. This is then multiplied, by the first multiplier 71, with the output signal $P_{y\ low}$ of the first signal power calculation means to provide $R_y = P_{y\ low}/P_{y\ high}$ which is the ratio of the signal power in the low frequency band to the signal power in the high frequency band for the filtered electronic input signal y.

The third frequency band filter 45 is also another low frequency band filter which is configured to allow the low frequency components to pass through but attenuates the high frequency components. The third frequency band filter 45 may be the same as the first frequency band filter 41. The third frequency band filter 45 is configured to receive the electronic output signal r provided by the microphone 7 as an input.

The third frequency band filter 45 is coupled to third signal power calculation means 55 so that the output of the third frequency band filter 45 is provided to the third signal power calculation means 55. The third signal power calculation means 55 are configured to determine the signal power in the low frequency components of the electronic output signal r provided by the microphone 7 and provide this an output signal $P_{r\ low}$.

The fourth frequency band filter 47 is another high frequency band filter which is configured to allow the high frequency components to pass through but attenuates the low frequency components. The fourth frequency band filter 47 may be the same as the second frequency band filter 42. The second frequency band filter 43 is also configured to receive the electronic output signal r provided by the microphone 7 as an input.

The fourth frequency band filter 47 is coupled to fourth signal power calculation means 57 so that the output of the fourth frequency band filter 47 is provided to the fourth signal power calculation means 55. The fourth signal power calculation means 57 are configured to determine the signal power in the high frequency components of the electronic output signal r provided by the microphone 7 and provide this an output signal $P_{r\ high}$.

The output signal $P_{r\ high}$ of the fourth power calculation means 57 is provided to an inverter 63 which inverts the signal $P_{r\ high}$ to provide $1/P_{r\ high}$. This is then multiplied by the second multiplier 73, with the output signal $P_{r\ low}$ of the third signal power calculation means to provide $R_r = P_{r\ low}/P_{r\ high}$ which is the ratio of the signal power in the low frequency band to the signal power in the high frequency band for the electronic output signal r provided by the microphone 7.

The output of the first multiplier 71 is provided to the inverter 65 and inverted to provide $1/R_y$ as an output signal. The output of the inverter 65 is then provided to the multiplier 75. The output of the second multiplier 73 is also provided to the third multiplier 75. The third multiplier 75 multiplies the two input signals to provide the ratio $R_{tot} = R_r/R_y$ as an output signal. This provides a comparison of the signal power in the electrical output signal r provided by the microphone 7 compared to the filtered electrical input signal y provided to the audio output device 5.

The ratio $R_{tot} = R_r/R_y$ is converted into decibels by the converter 77 to provide the control signal K. The value of the control signal K is therefore determined by the relative signal powers of the two input signals r, y provided to the detector 9. If the relative signal power changes the detector 9 detects this and the value of K will change accordingly.

Figure 6:
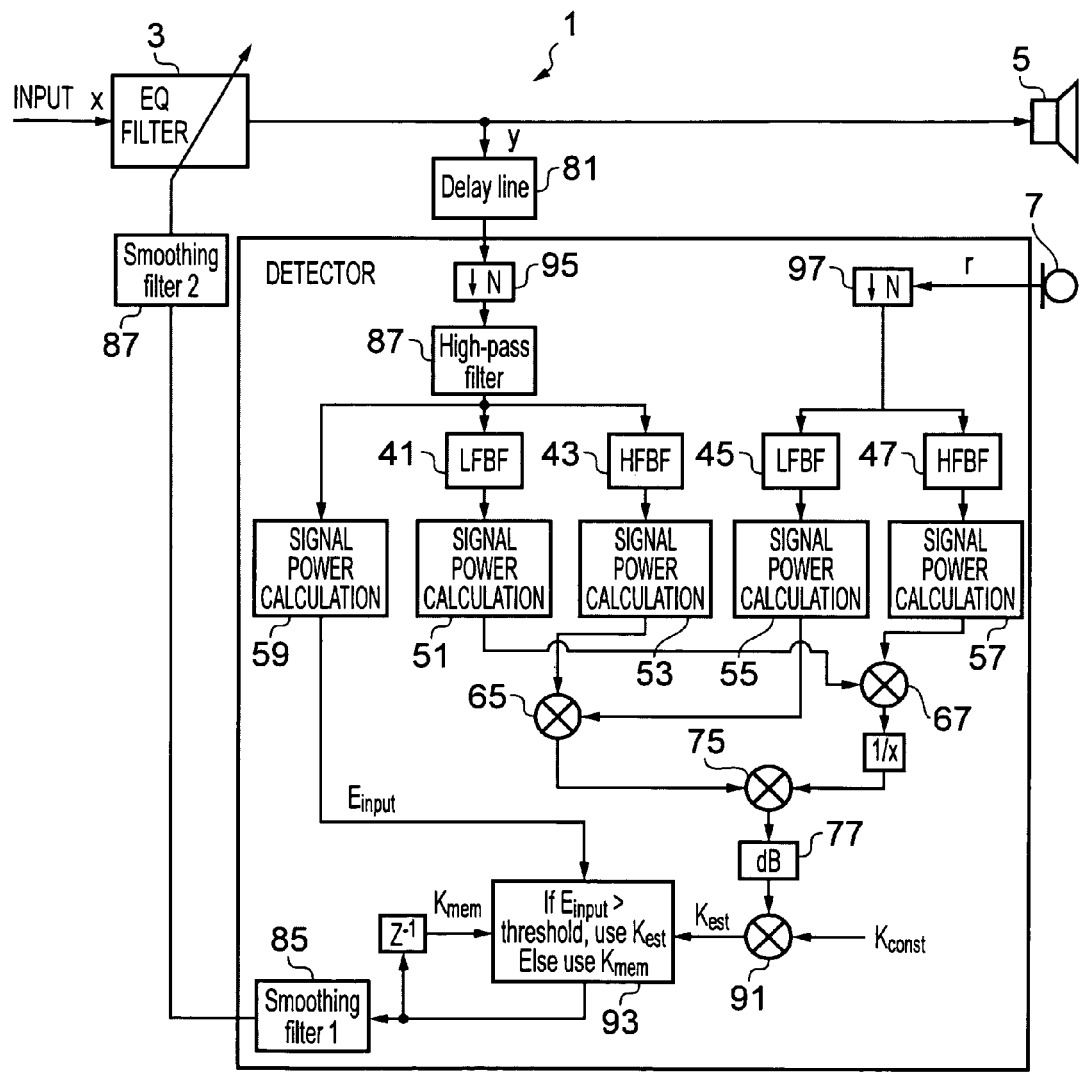
FIG. 6 illustrates an apparatus according to the first embodiment of the invention in more detail.

FIG. 6 schematically illustrates an apparatus 1 according to another embodiment of the invention. The apparatus 1 comprises a filter 3, an audio output device 5, a microphone 7 and a detector 9 as described in relation to the embodiment illustrated in FIG. 1.

The apparatus illustrated in FIG. 6 also comprises a delay line 81. The delay line 81 is connected between the filter 3 and the detector 9. The delay line 81 is configured to introduce a delay into the filtered electrical input signal y before it is provided to the detector 9. The delay may be configurable. The delay is used to synchronize the electrical output signal r and the filtered electrical input signal y so that they both relate to the same audio event. The filtered electrical input signal y for an audio event is delayed so that the detector 9 compares the electrical output signal r and the filtered electrical input signal y for the same audio event.

The detector 9 comprises a plurality of frequency band filters 41, 43, 45, 47, means for calculating the signal power 50, means for comparing the relative signal power 60 and means 77 for providing a control signal K as an output which operate as described above in relation to FIG. 5.

The detector in FIG. 6 comprises the additional component of a summer 91. The output signal K is added to $K_{const}$ by the summer 91 to provide $K_{est}$ as an output signal. $K_{const}$ is a constant value which is added to shift the output signal $K_{est}$ to zero when the apparatus 1 is held in a standard position.

The detector 9 also comprises a first downsampler 95, and a second downsampler 97. The downsamplers reduce the sampling rate by a factor N. In the embodiment of the invention illustrated in FIG. 6 both of the downsamplers decrease the sampling rate by the same factor N. The first downsampler 95 is configured to reduce the sampling rate of the filtered electrical input signal y before it is provided to the first and second frequency band filters 41, 43 and the second downsampler 97 is configured to reduce the sampling rate of the electrical output signal r provided by the microphone 7 before it is provided to the third and fourth frequency band filters 45, 47.

The detector 9 also comprises a high pass filter 87. The high pass filter is configured to filter out very low frequency signals which cannot be detected by the microphone 7. The high pass filter 87 is coupled to the down sampler 95 and the first and second frequency band filters 41, 43 such that after the filtered electrical input signal y has been downsampled it is provided to a high pass filter 87. The output of the high pass filer 84 is provided to the first and second frequency band filters 41, 43.

The detector 9 also comprises an additional signal power calculation means 59. The output of the high pass filer 84 is also provided to the additional signal power calculation means 59. The additional signal power calculation means 59 is configured to calculate the total signal power of the filtered electrical input signal y to proved $E_{input}$ as an output signal.

The output signal $E_{input}$ is provided to block 93. The output signal $K_{est}$ is also provided to block 93. Block 93 determines whether or not the value of $E_{input}$ is above a predetermined threshold. If $E_{input}$ is above a predetermined value then $K_{est}$ is provided as the control signal to the filter 3. If $E_{input}$ is below a threshold value then $K_{mem}$ is provided as the control signal to the filter 3. $K_{mem}$ is the last value of $K_{est}$ which was used and is used to avoid bias when the total signal power level is too low.

The apparatus 1 illustrated in FIG. 6 may also comprises a first smoothing filter 85 and a second smoothing filter 87. The first smoothing filter 85 and a second smoothing filter 87 are connected between the detector 9 and the filter 3 to filter the control signal before it is provided to the filter 3. In this example, the first smoothing filter 85 smoothes the output of the detector 9 between frames. In this example, the second smoothing filter 87 smoothes the output of the detector 9 between samples.

Figure 7:
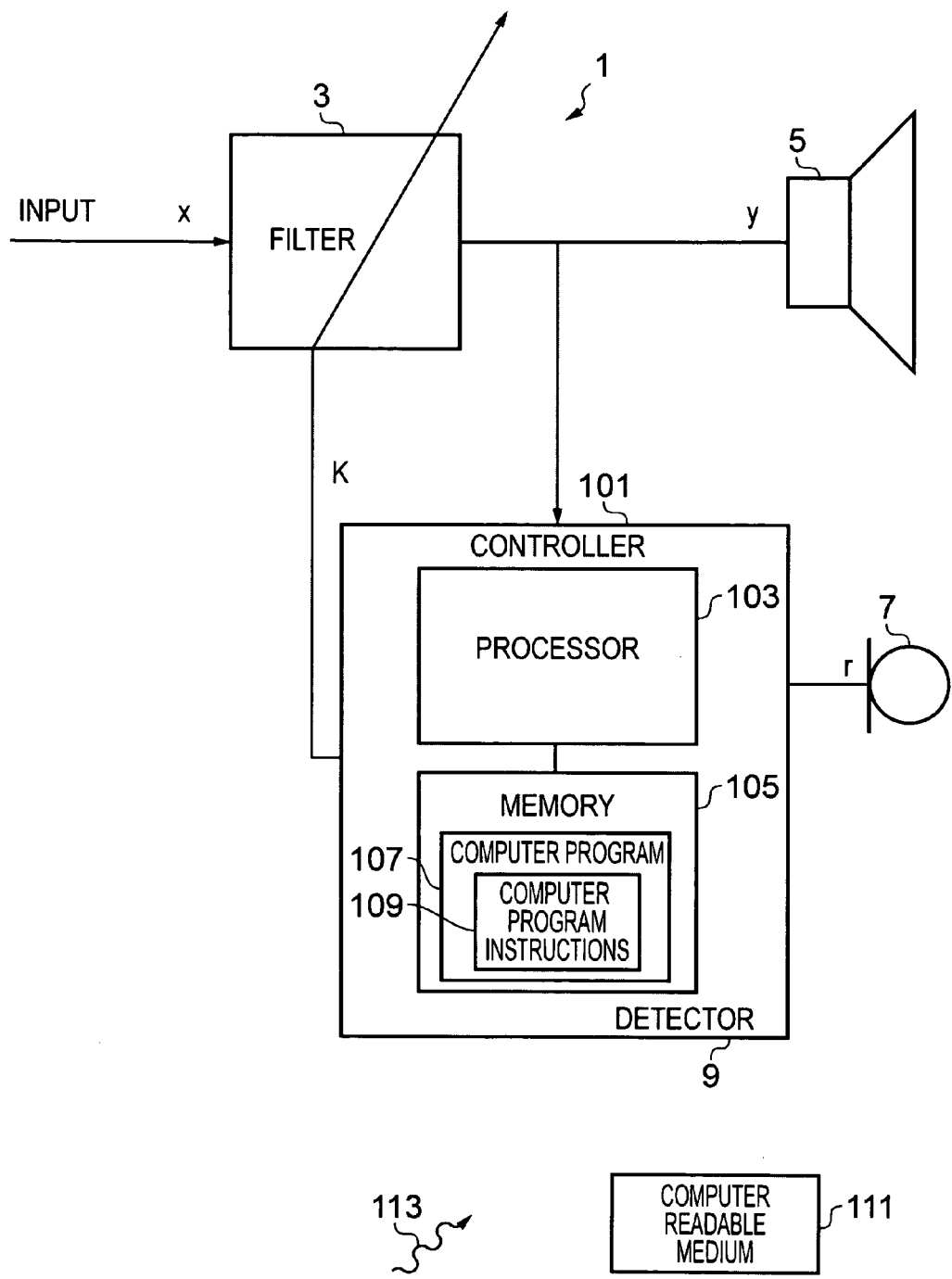
FIG. 7 illustrates an apparatus according to another embodiment of the invention.

FIG. 7 schematically illustrates an apparatus 1 according to another embodiment of the invention 1. The apparatus 1 comprises a filter 3, an audio output device 5 and a microphone 7 as described in relation to the embodiments illustrated in FIGS. 1 and 6.

In FIG. 7 the detector 9 comprises a controller 101 which is configured to detect a change in the signal power of the electrical output signal r provided by the microphone 7 relative to the filtered electrical input signal y provided to the audio output device.

The controller 101 provides means for controlling the filter 3. In some embodiments of the invention the controller 101 may also control other functions of the apparatus 1. In the illustrated embodiment the controller 101 comprises a processor 103 and a memory 105.

The controller 101 may be implemented using instructions that enable hardware functionality, for example, by using executable computer program instructions 109 in a general-purpose or special-purpose processor 103 that may be stored on a computer readable storage medium 111 (e.g. disk, memory etc) to be executed by such a processor 107.

The memory 105 stores a computer program 107 comprising computer program instructions 109 that control the operation of the filter 3 when loaded into the processor 103. The computer program instructions 109 provide the logic and routines that enables the apparatus 1 to perform the methods illustrated in FIG. 3. The processor 103 by reading the memory 105 is able to load and execute the computer program 107.

The computer program instructions 109 may provide computer readable program means for enabling receiving a filtered electrical input signal y where the filtered electrical input signal y is also provided to an audio output device 5; receiving an electrical output signal r provided by a microphone 7; detecting a change in the signal power of the electrical output signal r provided by the microphone 7 relative to the filtered electrical input signal y provided to the audio output device 5; and providing, in response to the detection of the change in the signal power, a control signal K to a filter 3 to control the filter 3 to filter the electrical input signal y provided to the audio output device to compensate for the detected change in signal power.

The computer program 107 may arrive at the apparatus 1 via any suitable delivery mechanism. The delivery mechanism may be, for example, a computer-readable storage medium 111, a computer program product, a memory device such as a flash memory, a record medium such as a CD-ROM or DVD, an article of manufacture that tangibly embodies the computer program 107. The delivery mechanism may be a signal configured to reliably transfer the computer program 107. The apparatus 1 may propagate or transmit the computer program 107 as a computer data signal.

Although the memory 105 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (e.g. Von Neumann)/parallel architectures but also specialized circuits such as field-programmable gate arrays (FPGA), application specific integration circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device.

The controller 101 is configured to receive the filtered electrical input signal y as a first input and the electrical output signal r provided by the microphone 7 as a second input. The controller 101 is configured to detect a change in the relative signal power of the two signals as described above and provide the control signal K to the filter 3 to control the filter 3 to compensate for the detected change in signal power.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. An apparatus comprising:
   a filter configured to filter an electrical input signal and provide a filtered electrical input signal to an audio output device;
   the audio output device configured to convert the filtered electrical input signal to an acoustic output signal used to reproduce sound signals in a user's ear such that the filter is controlled to filter the electrical input signal to compensate for distortion in the acoustic output signal in response to a change in position of the apparatus relative to the user's ear where the change in position causes the distortion in the acoustic output signal;
   a microphone configured to monitor the sound signals in the user's ear to detect components of the acoustic output signal and provide an electrical output signal corresponding to the detected components of the acoustic output signal, wherein the microphone is positioned in proximity to the audio output device; and
   a detector configured to receive the filtered electrical input signal provided to the audio output device as a first input and the electrical output signal provided by the microphone as a second input;

wherein the detector is configured to detect a change in signal power of the electrical output signal provided by the microphone relative to the filtered electrical input signal provided to the audio output device and, in response to the detection of the change in the signal power, provide a control signal to the filter to control the filter to compensate for the detected change in signal power;

wherein the apparatus and the microphone are configured to be positioned adjacent to a user's ear; and wherein the change in the signal power of the electrical output signal provided by the microphone, relative to the filtered electrical input signal that is provided to the audio output device and detected by the detector, provides a frequency response measurement of a system comprising the user's ear and the apparatus used to compensate for the distortion in the acoustic output signal in response to the change in position of the apparatus relative to the user's ear.

2. An apparatus as claimed in claim 1 wherein the filtered electrical input signal provided to the audio output device and the electrical output signal provided by the microphone comprise a first frequency component and a second frequency component and the detector is configured to detect the change in the signal power of the first frequency component.

3. An apparatus as claimed in claim 2 wherein the first frequency component is a low frequency component and the second frequency component is a high frequency component.

4. An apparatus as claimed in claim 1 wherein the apparatus is a wireless communications apparatus.

5. The apparatus according to claim 1, wherein the distortion is caused by a low frequency band of the acoustic output signal being affected based on the relative position of the apparatus against the user's ear.

6. A method comprising:
receiving a filtered electrical input signal that has been filtered to compensate for distortion in an acoustic output signal in response to a change in position of an audio output device relative to a user's ear where the change in position causes the distortion in the acoustic output signal, wherein the acoustic output signal is used to reproduce sound signals in the user's ear, wherein the filtered electrical input signal is provided to the audio output device;

receiving an electrical output signal provided by a microphone, wherein the microphone is positioned in proximity to the audio output device and monitors the sound signals in the user's ear to detect components of the acoustic output signal and provides the electrical output signal corresponding to the detected components of the acoustic output signal;

detecting a change in signal power of the electrical output signal provided by the microphone, relative to the filtered electrical input signal provided to the audio output device; and providing, in response to the detection of the change in the signal power, a control signal to a filter to control the filter to filter the electrical input signal provided to the audio output device to compensate for the detected change in the signal power;

wherein the audio output device and the microphone are positioned adjacent to the user's ear; and wherein the detected change in the signal power of the electrical output signal provided by the microphone, relative to the filtered electrical input signal that is provided to the audio output device, provides a frequency response measurement of an acoustical system comprising the user's ear and the audio output device used to compensate for the distortion in the acoustic output signal in response to the change in position of the audio output device relative to the user's ear.

7. A method as claimed in claim 6 wherein the filtered electrical input signal provided to the audio output device and the electrical output signal provided by the microphone comprise a first frequency component and a second frequency component and the detected change in the signal power of the output signal provided by the microphone corresponds to a change in the signal power of the first frequency component.

8. A method as claimed in claim 7 wherein the first frequency component is a low frequency component and the second frequency component is a high frequency component.

9. A non-transitory computer readable storage medium comprising program instructions stored therein for causing a computer to perform the method of claim 6.

10. A non-transitory computer-readable storage medium encoded with instructions that, when executed by a processor, perform the method as claimed in claim 6.

11. The apparatus according to claim 6, wherein the distortion is caused by a low frequency band of the acoustic output signal being affected based on the relative position of the apparatus against the user's ear.

12. A non-transitory computer readable storage medium comprising computer program instructions stored therein configured to control an apparatus, the program instructions enabling, when loaded into a controller:
receiving a filtered electrical input signal that has been filtered to compensate for distortion in an acoustic output signal in response to a change in position of an audio output device relative to a user's ear where the change in position causes the distortion in the acoustic output signal, wherein the acoustic output signal is used to reproduce sound signals in the user's ear, wherein the filtered electrical input signal is provided to the audio output device;

receiving an electrical output signal provided by a microphone, wherein the microphone is positioned in proximity to the audio output device and monitors the sound signals in the user's ear to detect components of the acoustic output signal and provides the electrical output signal corresponding to the detected components of the acoustic output signal;

detecting a change in signal power of the electrical output signal provided by the microphone relative to the filtered electrical input signal provided to the audio output device; and providing, in response to the detection of the change in the signal power, a control signal to a filter to control the filter to filter the electrical input signal provided to the audio output device to compensate for the detected change in the signal power;

wherein the audio output device and the microphone are positioned adjacent to the user's ear; and wherein the detected change in the signal power of the electrical output signal provided by the microphone, relative to the filtered electrical input signal that is provided to the audio output device, provides a frequency response measurement of an acoustical system comprising the user's ear and the audio output device used to compensate for the distortion in the acoustic output signal in response to the change in position of the audio output device relative to the user's ear.

13. The apparatus according to claim 12, wherein the distortion is caused by a low frequency band of the acoustic output signal being affected based on the relative position of the apparatus against the user's ear.

14. An apparatus comprising:
- a first physical input port configured to receive a filtered electrical input signal provided to an audio output device;
- a second physical input port configured to receive an electrical output signal provided by a microphone, wherein the microphone is positioned in proximity to the audio output device and monitors sound signals in a user's ear to detect components of an acoustic output signal and provides the electrical output signal corresponding to the detected components of the acoustic output signal;
- a physical output port configured to provide an output signal to a filter which filters the electrical input signal provided to the audio output device; wherein the filter is controlled to filter the electrical input signal to compensate for distortion in the acoustic output signal in response to a change in position of the apparatus relative to the user's ear where the change in position causes the distortion in the acoustic output signal, wherein the acoustic output signal is used to reproduce the sound signals in the user's ear;
- wherein the apparatus is configured to detect a change in signal power of the electrical output signal provided by the microphone relative to the filtered electrical input signal provided to the audio output device and, in response to the detection of the change in the signal power, provide a control signal to the filter to control the filter to compensate for the detected change in the signal power;
- wherein the apparatus and the microphone are configured to be positioned adjacent to the user's ear; and
- wherein the change in the signal power of the electrical output signal provided by the microphone, relative to the filtered electrical input signal that is provided to the audio output device, provides a frequency response measurement of a system comprising the user's ear and the apparatus used to compensate for the distortion in the acoustic output signal in response to the change in position of the apparatus relative to the user's ear.

15. An apparatus as claimed in claim 14 wherein the filtered electrical input signal provided to the audio output device and the electrical output signal provided by the microphone comprise a first frequency component and a second frequency component and the apparatus is configured to detect a change in the signal power of the first frequency component.

16. An apparatus as claimed in claim 15 wherein the first frequency component is a low frequency component and the second frequency component is a high frequency component.

17. The apparatus according to claim 14, wherein the distortion is caused by a low frequency band of the acoustic output signal being affected based on the relative position of the apparatus against the user's ear.

* * * * *